United States Patent
Schmidtke

(10) Patent No.: US 10,287,492 B2
(45) Date of Patent: May 14, 2019

(54) METHOD FOR PRODUCING A CONVERSION ELEMENT

(71) Applicant: OSRAM Opto Semiconductors GmbH, Regensburg (DE)

(72) Inventor: Kathy Schmidtke, Mainburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/752,563

(22) PCT Filed: Aug. 5, 2016

(86) PCT No.: PCT/EP2016/068783
§ 371 (c)(1),
(2) Date: Feb. 13, 2018

(87) PCT Pub. No.: WO2017/025473
PCT Pub. Date: Feb. 16, 2017

(65) Prior Publication Data
US 2018/0237689 A1    Aug. 23, 2018

(30) Foreign Application Priority Data
Aug. 13, 2015  (DE) .................. 10 2015 113 360

(51) Int. Cl.
C09K 11/02    (2006.01)
C09K 11/08    (2006.01)
H01L 33/50    (2010.01)

(52) U.S. Cl.
CPC .......... *C09K 11/025* (2013.01); *C09K 11/02* (2013.01); *C09K 11/08* (2013.01); *H01L 33/502* (2013.01);
(Continued)

(58) Field of Classification Search
CPC ....................................... C09K 11/02
See application file for complete search history.

(56) References Cited

U.S. PATENT DOCUMENTS 4,416,862 A * 11/1983 Gencev ............... C01F 7/60
                                                          423/135
4,436,646 A    3/1984 Takahara et al.
(Continued)

FOREIGN PATENT DOCUMENTS

DE    3235657 A1    4/1983
DE    69300948 T3    8/2003
(Continued)

OTHER PUBLICATIONS

Lü, X., "Silica Encapsulation Study on SrAl2O4:Eu2+, Dy3+ Phosphors," Elsevier, Materials Chemistry and Physics, 93, 2005, 5 pages.

*Primary Examiner* — William A Harriston
(74) *Attorney, Agent, or Firm* — Slater Matsil, LLP

(57) ABSTRACT

A method for producing a conversion element is disclosed. In an embodiment, the method includes providing an acidic medium having a pH value of less than 2, adding a conversion material into the acidic medium thereby forming a mixture and adding a silicate solution having a viscosity between 2 to 10 000 poize inclusive to the mixture such that the pH value during the addition of the silicate solution is smaller than 2. The method further includes obtaining a precipitate which contains the conversion material and silicon dioxide as a matrix material, separating the precipitate, washing the precipitate with a washing medium, wherein the washing medium has a pH value of less than 2; and hardening the precipitate thereby forming the conversion element.

14 Claims, 4 Drawing Sheets

(52) U.S. Cl.
CPC ............... *H01L 2933/0041* (2013.01); *H01L 2933/0091* (2013.01)

(56) References Cited

U.S. PATENT DOCUMENTS

| | | | |
|---|---|---|---|
| 4,973,462 | A | 11/1990 | Akira et al. |
| 5,746,944 | A | 5/1998 | Braconnier |
| 7,481,951 | B2 | 1/2009 | Jermann et al. |
| 2011/0236288 | A1 | 9/2011 | Panz et al. |
| 2012/0256533 | A1* | 10/2012 | Seto .................. C04B 35/58085 313/498 |
| 2013/0240775 | A1* | 9/2013 | Kita ........................ H01L 35/16 252/62.3 T |
| 2014/0138689 | A1* | 5/2014 | Lee ........................ B01J 35/004 257/55 |
| 2014/0217445 | A1* | 8/2014 | Jansen ................. C09K 11/025 257/98 |
| 2015/0318450 | A1* | 11/2015 | de Brouwer .......... H01L 23/293 362/84 |
| 2016/0312118 | A1* | 10/2016 | Fiedler ............... C09K 11/7728 |
| 2017/0077402 | A1* | 3/2017 | Oooka ................ H01L 51/0007 |
| 2018/0282620 | A1* | 10/2018 | Ichikawa ............. C09K 11/616 |

FOREIGN PATENT DOCUMENTS

| | | |
|---|---|---|
| DE | 10223988 A1 | 12/2003 |
| JP | S63291808 A | 11/1988 |
| JP | 2012504101 A | 2/2012 |
| WO | 2010037702 A1 | 4/2010 |
| WO | 2014041548 A1 | 3/2014 |

\* cited by examiner

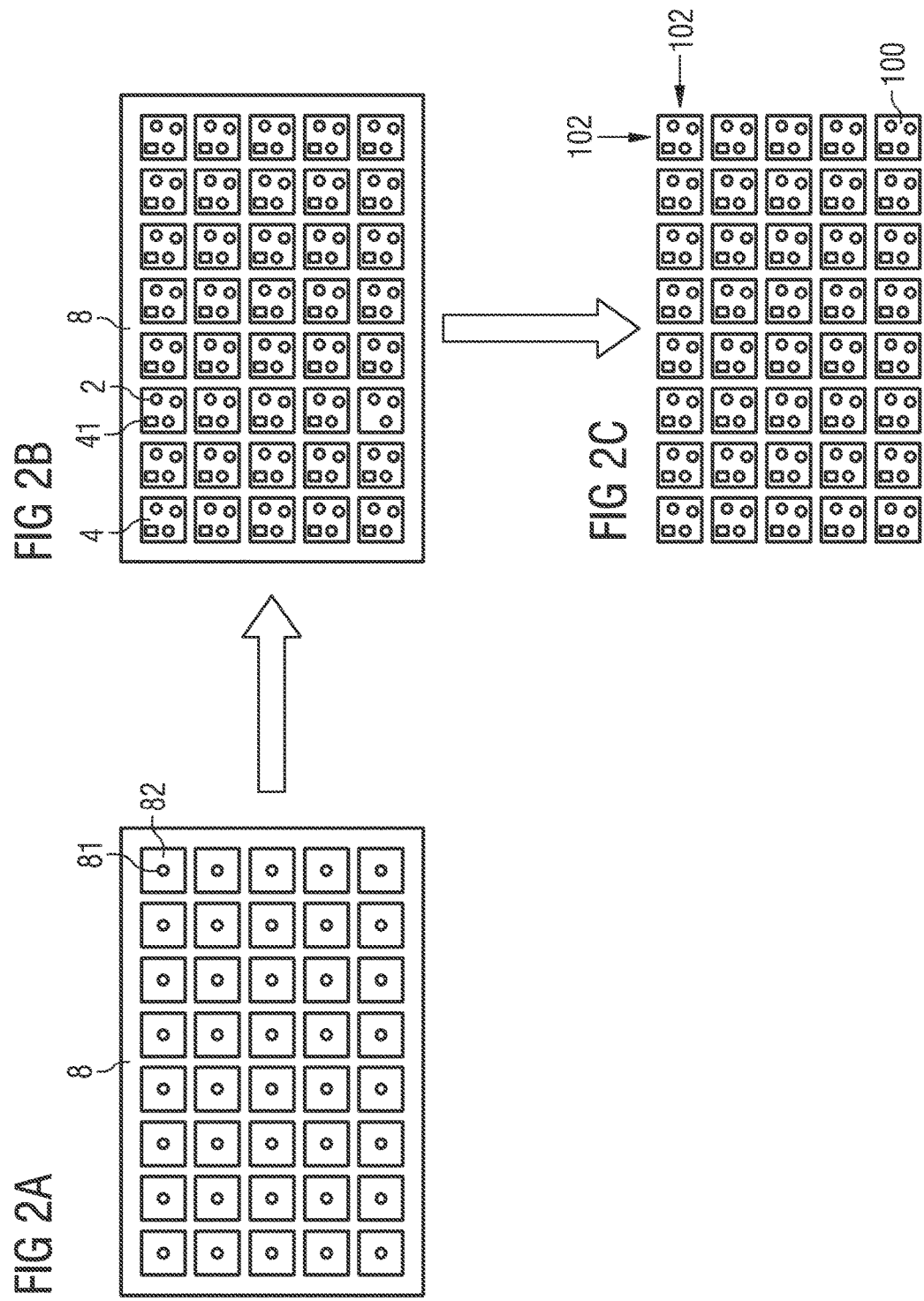

METHOD FOR PRODUCING A CONVERSION ELEMENT

This patent application is a national phase filing under section 371 of PCT/EP2016/068783, filed Aug. 5, 2016, which claims the priority of German patent application 10 2015 113 360.1, filed Aug. 13, 2015, each of which is incorporated herein by reference in its entirety.

TECHNICAL FIELD

The invention relates to a method for producing a conversion element for an optoelectronic component.

BACKGROUND

Conversion elements are used in optoelectronic components, in particular in inorganic light-emitting diodes, in order to convert the radiation emitted by an optoelectronic semiconductor chip into a radiation having a changed wavelength, in particular longer wavelength. The conversion element generally has silicone or a ceramic as a matrix material, in which a conversion material is embedded. However, the conversion elements, which include silicone, have a low aging stability.

SUMMARY OF THE INVENTION

Embodiments of the invention provide a method for producing a conversion element for an optoelectronic component which provides a stable conversion element. In particular, the conversion element has a high temperature and/or light resistance and/or ageing stability. Further embodiments provide a cost-effective method for producing a conversion element for an optoelectronic component.

In at least one embodiment, the method for producing a conversion element for an optoelectronic component comprises the following steps: A) providing an acidic medium having a pH value of less than 2, B) adding a conversion material into the acidic medium, C) adding a silicate solution having a viscosity from 2 to 10 000 poise to the mixture obtained under step B) in such a way that the pH value during the addition in step C) is smaller than 2, wherein a precipitate is obtained which comprises the conversion material and silicon dioxide as a matrix material, D) separation of the precipitate, E) washing the precipitate with a washing medium, wherein the washing medium has a pH value of less than 2, and F) curing the precipitate to produce the conversion element.

In various embodiments, the conversion element produced by this method is designed for absorbing the radiation emitted by an optoelectronic semiconductor chip during operation of the optoelectronic component and converting it into a radiation having a changed wavelength, i.e., a longer wavelength. For example, the converted radiation has a wavelength or a wavelength maximum in the visible region.

According to at least one embodiment, the optoelectronic component is a light-emitting diode, LED for short. The optoelectronic component is then able to emit blue light, green light, red light or white light.

According to at least one embodiment, the optoelectronic component comprises a semiconductor chip. The semiconductor chip comprises a semiconductor layer sequence. The semiconductor layer sequence can have an active region, for example, a conventional pn-junction with or without a single quantum well structure or a multiple quantum well structure. The semiconductor layer sequence of the semiconductor chip is preferably based on a III-V compound semiconductor material. The semiconductor material is preferably a nitride compound semiconductor material such as $Al_nIn_{1-n-m}Ga_mN$ or else a phosphide compound semiconductor material $Al_nIn_{1-n-m}Ga_mP$, wherein in each case $0 \leq n \leq 1$, $0 \leq m \leq 1$, and $n+m \leq 1$. The semiconductor material can likewise be $Al_xGa_{1-x}As$, where $0 \leq x \leq 1$. In this case, the semiconductor layer sequence can have dopants and additional constituents. For the sake of simplicity, however, only the essential components of the crystal lattice of the semiconductor layer sequence are named, like Al, As, Ga, In, N or P, even if these can be partially replaced and/or supplemented by small quantities of further substances.

During operation of the semiconductor chip, an electromagnetic radiation is generated in the active layer. A wavelength or the wavelength maximum of the radiation is preferably in the ultraviolet and/or visible and/or IR spectral range, in particular at wavelengths between 420 nm and 800 nm inclusive, for example, between 440 nm and 480 nm inclusive.

The method described here has in particular the method steps A) to F). In particular, the method steps A) to F) take place in said order. In addition, in particular before method step F), an additional method step H) can be carried out. After method step F), an additional method step G) and/or I) can be carried out.

According to at least one embodiment, the method comprises a method step A), providing an acidic medium having a pH value of less than 2.

According to at least one embodiment, the acidic medium is selected from a group consisting of hydrochloric acid, phosphoric acid, nitric acid, sulphuric acid, chlorosulfonic acid, sulforyl chloride, perchloric acid and combinations thereof.

According to at least one embodiment, the acidic medium can be present in concentrated or dilute form. Here and in the following, concentrated form means that the acidic medium is present without the addition of water. For example, a sulphuric acid in concentrated form means that the sulphuric acid has a concentration of 94 to 96%. A diluted acidic medium means here and in the following that water is added to the acidic medium. This can be carried out from a concentrated medium, for example, a 94 to 96% strength sulphuric acid, by adding water, a diluted acidic medium, such as a dilute sulphuric acid, can be produced. In particular, the pH of the dilute acidic medium is less than 2.

In particular, the acidic medium can have different normalities. For example, the hydrochloric acid can have a normality between 2 N and 14 N, for example, the hydrochloric acid can have a normality between 3 N and 6N. The phosphoric acid can have a normality between 2 and 59 N, for example, between 4 and 20 N. The nitric acid can have a normality between 1 and 24 N, for example, between 1 and 15 N. The sulphuric acid can have a normality between 1 and 37 N, for example, between 2 and 10 N. In particular, sulphuric acid is used as the acidic medium.

According to at least one embodiment, the acidic medium additionally comprises water. In particular, the water is distilled water or deionized water.

According to at least one embodiment, the acidic medium has a pH value of less than 2. In particular, the acidic medium has a pH value of less than 1.5, in particular of less than 1, preferably of less than 0.5.

The pH value can be determined by means of potentiometry or by ion-sensitive field-effect transistors or by the reaction of indicator dyes. In particular, the pH value can be determined by means of a pH meter.

According to at least one embodiment, the method comprises a step B), adding a conversion material into the acidic medium. The conversion material can be selected from a group consisting of $(Y,Lu,Gd,Tb)_3(Al_{1-x}Ga_x)_5O_{12}$, $(Ba,Sr,Ca)Si_2O_2N_2$, $(Ba,Sr,Ca)_2SiO_4$, $(Ba,Sr,Ca)_2Si_5N_8$, $(Sr,Ca)AlSiN_3 \cdot Si_2N_2O$, $(Sr,Ca)AlSiN_3$ and $Ca_8Mg(SiO_4)_4Cl_2$.

According to at least one embodiment, the conversion element is formed as a layer. In particular, the conversion element has a layer thickness of 40 μm to 60 μm, for example, 50 μm.

According to at least one embodiment, the conversion material is formed as particles. In particular, the conversion material has an average particle size of between 5 and 30 μm inclusive, in particular between 10 and 30 μm, preferably between 15 and 30 μm.

According to at least one embodiment, in method step B) the conversion material is homogeneously dispersed into the acidic medium. This can be done, for example, by means of stirring or shaking.

According to at least one embodiment, scattering particles can additionally be dispersed in step B). Any materials which are designed to reflect and/or scatter electromagnetic radiation are suitable as scattering particles. For example, scattering particles made of titanium dioxide and/or $Al_2O_3$ can be dispersed. In particular, the scattering particles have an average diameter of between 0.5 μm and 1 μm inclusive.

According to at least one embodiment, the conversion material has a proportion of 50% by weight to 60% by weight, for example, between 55 and 57% by weight, in the matrix material.

According to at least one embodiment, the method comprises a step C), addition of a silicate solution having a viscosity from 2 to 10 000 poise to the mixture obtained under step B) in such a way that the pH value during the addition in step C) is less than 2, wherein a precipitate is obtained which comprises the conversion material and silicon dioxide as a matrix material.

According to at least one embodiment, the silicate solution in step C) is a solution of water glass, in particular of a soda water glass, potassium water glass or lithium water glass.

An alkali silicate with different proportions of alkali oxides, such as $Na_2O$ and/or $K_2O$, is referred to here and below as water glass. For example, a highly concentrated water glass with an $SiO_2$ content of 36 to 37 wt. % and an $Na_2O$ content of 17.8 to 18.4 wt. % and a viscosity at 20° C. of approximately 600 poise can be referred to as sodium water glass. The silicate solution can be obtained from different manufacturers, for example, from the company Van Baerle Chemische Fabrik. Silicate solutions are known to the person skilled in the art, for example, from WO 2010/037702 A1, and are therefore not explained further at this point.

The silicate solution has, in particular, a viscosity from 2 to 10 000 poise, preferably between 3 and 5000 poise, particularly preferably between 4 and 1000 poise and very particularly preferably between 4 and 800 poise, very particularly preferably between 4 and 100 poise and particularly preferably between 5 and 50 poise. The viscosity can be determined by means of a ball drop viscosimeter.

The silicate solution is added to the mixture of the conversion material and the acidic medium in step C). In particular, the pH value is at any time, that is to say during the entire addition in step C), less than 2, in particular less than 1.5, in particular less than 1 and preferably less than 0.5.

According to at least one embodiment, the silicate solution is added in droplet form into the mixture of the conversion material and the acidic medium. For example, the dropwise addition of the silicate solution can be effected by means of spray units, drop generators, prilling plates. These methods are known to the person skilled in the art and are therefore not explained in more detail here. By adding the silicate solution in droplet form, a readily filterable precipitate can be obtained.

The precipitate is in particular a suspension. The precipitate contains the silicon dioxide as a matrix material and the conversion material.

According to at least one embodiment, the method step C) is carried out at a temperature of 20 to 95° C., preferably between 30 and 90° C., for example, between 40 and 80° C. In particular, the temperature in step C) is kept at this temperature.

According to at least one embodiment, the method comprises a step D), separating the precipitate. In other words, the precipitate is separated from the remaining constituents of the mixture. Depending on the filterability of the precipitate, this can be carried out by filtration techniques known to the person skilled in the art. For example, the precipitation can be effected by means of filter presses or rotary filters. Alternatively, the precipitate can also be obtained by centrifuging and/or by decanting off the liquid constituents of the precipitate.

According to at least one embodiment, the method comprises a step E), washing the precipitate with a washing medium, wherein the washing medium has a pH value of less than 2, in particular a pH value of less than 1.5 or 1 or 0.5. The acidic media already mentioned in step A) can be used as the washing medium.

Alternatively, a chelating reagent can be added as the washing medium.

According to at least one embodiment, an indicator made of peroxide can be added in at least one of steps A) to D), in particular in step A). The indicator indicates in particular a color change and thus indicates the completeness of the precipitation of the precipitate. In particular, this can take place not on the LED base but on the material basis.

In particular, the peroxide comprises titanium-(IV)-ions. In particular, hydrogen peroxide or potassium peroxydisulfate containing the titanium is used as the indicator-(IV)-ions. The titanium-(IV)-ions have a yellow-orange-colored coloration under acidic conditions. The degree of purification can be determined by the yellow-orange-colored coloration of the mixture, for example, during the washing in step E). Since, even at pH values above 2, the titanium is slightly deposited on the resulting precipitate and thus represents a very stubborn impurity, the degree of cleaning of the precipitate can thus be controlled.

Method step E) can be carried out until visually no yellow-orange-colored coloration of the indicator is shown.

Alternatively or additionally, the method step E) can also be carried out with a washing medium of distilled water or deionized water. In particular, it is washed until the filtrate, i.e., the washing suspension, has a conductivity of less than or equal to 9 μS/cm, preferably less than or equal to 5 μS/cm. The conductivity can be determined by means of a conductivity measuring device.

The method step E) can preferably be carried out at temperatures of 15 to 100° C.

According to at least one embodiment, the method comprises a method step F), curing the precipitate to produce the conversion element.

According to at least one embodiment, the curing in step F) is carried out by means of a gas flow. In addition, the curing in method step F) can be carried out under pressure. The pressure can be affected by a press. The pressure can be, for example, between 80 and 150 bar, for example, 100 bar. The gas flow can be a gas vapor, for example, a water vapor. The contact of the precipitate with the gas stream and optionally under pressure leads to hardening and solidifying of the conversion element.

Alternatively or additionally, the method steps can also be carried out several times, so that a layer system consisting of the conversion material and the matrix material is produced. In particular, the color locus is additionally set.

In addition, before step F), the precipitate can be converted into a mold. In particular, the precipitate is gel-like when transferred into the mold.

The mold can have any shape. For example, in a plan view, the mold can have a rectangular shape with a surface area of, for example, 1 mm$^2$, 2 mm$^2$ or 750 μm$^2$ or a barren shape. The mold can have a cavity into which the precipitate is introduced. The cavity can have a hole. In particular, the side products produced in step F), such as water, are removed through the hole.

According to at least one embodiment, the mold has a screen. As a result, the gas flow can completely penetrate the conversion element and the aqueous constituents can emerge from the conversion element, so that the conversion element can harden completely.

According to at least one embodiment, before step F), an additional step H) is carried out, the application of the precipitate washed after step F) onto an optoelectronic semiconductor chip by means of spray coating. In particular, the viscosity of the precipitate is adjusted to the process viscosity.

According to at least one embodiment, the method comprises, after step F), an additional step G), applying the conversion element to an optoelectronic semiconductor chip. In particular, the conversion element, that is to say as a prefabricated body, is arranged in a so-called pick-and-place process onto a radiation exit area of the semiconductor chip. The application can be effected directly or indirectly, that is to say in direct mechanical and/or electrical contact or in indirect mechanical or electrical contact. In the case of indirect electrical or mechanical contact, a further layer, for example, an adhesive layer, is arranged between the conversion element and the optoelectronic semiconductor chip.

In particular, the conversion element has sharp edges. In other words, the conversion element is polygonal, for example, cuboidal, wherein the edges are not rounded at the transition from one cuboid surface to the other cuboid surface. In particular, the side faces of the conversion element are arranged in a form-fitting manner, in a plan view of the radiation exit area, with the side faces of the semiconductor chip.

According to at least one embodiment, after step F), an additional step I) is carried out, grinding of the conversion element. The light output of the conversion element can thus be increased.

With the method described here, a conversion element can be provided which has a very clean and highly pure matrix material made of silicon dioxide, in which the conversion material is dispersed. In particular, the conversion material is homogeneously distributed in the matrix material. With the precipitation of the precipitate in combination with the conversion material, in particular an alternative conversion element can be provided. The conversion element can also be produced in a cost-effective and reliable manner. Furthermore, the conversion element is not subject to aging. Furthermore, any phosphors or mixtures of the phosphors can be dispersed into the conversion element. The conversion element can have a flexible shape.

The invention further relates to a conversion element. The conversion element is preferably produced using the described method for producing a conversion element for an optoelectronic component. This means that all the features disclosed for the method for producing a conversion element are also disclosed for the component and vice versa.

The conversion element comprises in particular a conversion material which can be selected from the materials described above. In addition, the conversion element has a matrix material made of silicon dioxide. The silicon dioxide is in particular a high-purity silicon dioxide. High-purity silicon dioxide, which is referred to here and below, is characterized in that the content of impurities in the silicon dioxide is very low. In particular, the proportion of aluminum in the silicon dioxide is less than 1 ppm. Alternatively or additionally, the proportion of boron in the silicon dioxide is less than 0.1 ppm. Alternatively or additionally, the proportion of calcium in the silicon dioxide is less than 0.3 ppm. Alternatively or additionally, the proportion of iron in the silicon dioxide is less than 0.6 ppm. Alternatively or additionally, the proportion of nickel in the silicon dioxide is less than 0.5 ppm. Alternatively or additionally, the proportion of phosphorus in the silicon dioxide is less than 0.1 ppm. Alternatively or additionally, the proportion of titanium is less than or equal to 1 ppm. Alternatively or additionally, the proportion of zinc is less than or equal to 0.3 ppm. In particular, the sum of the impurities in the silicon dioxide including sodium and potassium amounts to less than 5 ppm, preferably less than 4 ppm, particularly preferably between 0.5 and 3 ppm or between 1 and 3 ppm.

The invention further relates to an optoelectronic component. The optoelectronic component preferably comprises the conversion element described above. This means that all the features disclosed for the method for producing a conversion element and embodiments are also disclosed for the conversion element and vice versa.

According to at least one embodiment, the optoelectronic component comprises an optoelectronic semiconductor chip. The conversion element is arranged downstream of the optoelectronic semiconductor chip. The optoelectronic semiconductor chip and the conversion element are embedded in particular in a potting, for example, made of silicone. The potting can further comprise scattering particles, for example, made of titanium dioxide. In addition, the optoelectronic semiconductor chip can be arranged on a carrier or substrate. The carrier or substrate can be, for example, a silicon wafer.

The invention further relates to a method for producing an optoelectronic component. The method preferably produces the optoelectronic component. This means that all of the features described for the method for producing a conversion element, features and embodiments disclosed for the conversion element and/or for the optoelectronic component are also disclosed for the method for producing an optoelectronic component and vice versa.

According to at least one embodiment, the method comprises the following steps: a) providing a carrier or a substrate, b) applying at least one optoelectronic semiconductor chip to the substrate or the carrier, c) applying the conversion element to the respective optoelectronic semiconductor chip, and d) optionally separating a plurality of optoelectronic semiconductor chips.

In particular, before or after step C), the respective optoelectronic semiconductor chip can be encapsulated with a potting. The potting can be made of silicone, in which scattering particles can additionally be dispersed.

According to at least one embodiment, the applied conversion element is resistant to temperature and/or electromagnetic radiation.

The inventor has recognized that the here described method for producing a conversion element can produce a cost-effective conversion element using a simple matrix material. An essential method feature is the control of the pH value of the matrix material, in particular of the silicon dioxide, and the reaction media in which the matrix material and conversion material are located during the various method steps. Without being tied to a particular theory, the inventor is of the opinion that, by a very low pH value, ideally no free negatively charged SiO groups are present on the silicon dioxide surface and can be bound to the interfering metal ions. At a very low pH value, the surface is even positively charged, so that metal cations are repelled from the silica surface. If the metal ions are then washed out as long as the pH is very low, it can be prevented that the metal ions accumulate on the surface of the matrix material. If the silica surface has a positive charge, it is prevented that silicic acid particles attach to one another and cavities are thereby formed in which impurities can become deposited. The method can thus be carried out without the use of chelating reagents and/or ion exchange columns. In addition, no calcination steps are required. The method for producing a conversion element is thus easier and more cost-effective.

BRIEF DESCRIPTION OF THE DRAWINGS

Further advantages, advantageous embodiments and developments will become apparent from the exemplary embodiments described below in conjunction with the figures.

FIGS. 2A to 2C show a method for producing a conversion element according to an embodiment.

In the exemplary embodiments and figures, identical or identically acting elements can in each case be provided with the same reference symbols. The elements illustrated and their size relationships among one another are not to be regarded as true to scale; rather, individual elements, such as, for example, layers, components and regions, are illustrated with an exaggerated size for better representability and/or for a better understanding.

DETAILED DESCRIPTION OF ILLUSTRATIVE EMBODIMENTS

Figure 1A:
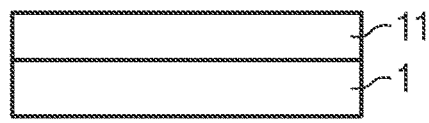
FIGS. 1A to 1F show a method for producing a conversion element according to an embodiment.
Figure 1B:
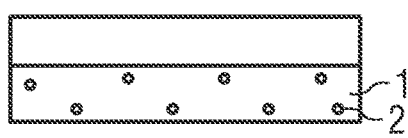
Figure 1C:
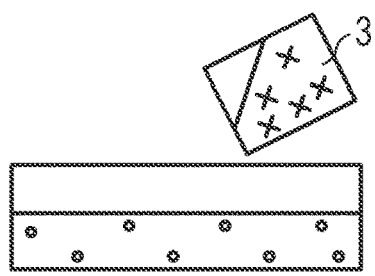
Figure 1D:
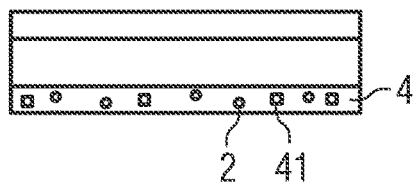
Figure 1E:
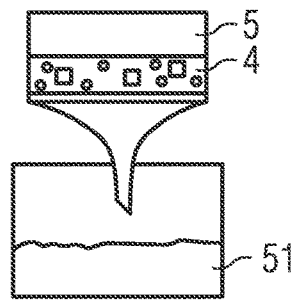
Figure 1F:
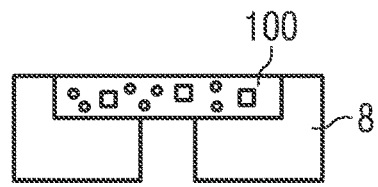

FIGS. 1A to 1F show a method for producing a conversion element according to an embodiment. FIG. 1A shows the provision of an acidic medium 1 having a pH value of less than 2 in a container 11. Subsequently, a conversion material 2, as shown in FIG. 1B, is added to the acidic medium 1. Subsequently, as shown in FIG. 1C, a silicate solution 3 can be added to this mixture of the conversion material 2 and the acidic medium 1. The silicate solution 3 has, in particular, a viscosity between 2 to 10 000 poise inclusive. The pH value during the addition in step C) is smaller than 2. A precipitate 4 is obtained, as shown in FIG. 1D. The precipitate 4 comprises a conversion material 2 and silicon dioxide 41 as a matrix material, or consists thereof. Alternatively, the precipitate 4 can also have scattering particles which have been added, for example, in method step B) (not shown here). Subsequently, the precipitate 4, as shown in FIG. 1E, is separated. The precipitate 4 can be, for example, filtered. A filtrate 51 is produced. Subsequently, the washing of the precipitate 4 can take place (not shown here). The washing can be carried out with a washing medium 6, for example, an acidic medium 1, which has already been provided in method step A). In particular, the pH value of the washing medium is less than 2. After this washing with the acidic medium, the washing can alternatively or additionally be carried out by means of distilled water. A washing filtrate is produced as a side product. After the washing of method step E), the precipitate 4 can be cured. For this purpose, the precipitate 4 can be converted into a mold, as shown in FIG. 1F, and the curing can be carried out. The curing can be effected, for example, by means of a gas flow and under pressure, for example, at 100 bar.

The conversion element 100, which is cured at least after step F), has in particular a hardness which corresponds to the hardness of the silicon dioxide, which is a glass hardness.

FIGS. 2A to 2C show a method for producing a conversion element according to an embodiment. FIG. 2A shows a mold 8. The mould 8 shows different cavities 82 each having a hole 81. The precipitate 4, which has been washed in particular after step E), can be filled into the mold 8 (FIG. 2B). The precipitate 4 can subsequently be cured (step F). This can be affected by means of a gas flow under pressure, for example, at 100 bar. The respective hole is designed in particular to dissipate the side products, such as water, which are to be eliminated during the curing in step F). The result is a conversion element which has a rectangular shape in plan view. The shape of the conversion element is not limited to the rectangular shape. The conversion element can be converted into any desired form. The conversion element 100 has in particular sharp edges 102 (FIG. 2C).

Figure 3A:
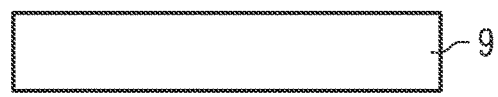
FIGS. 3A to 3F and FIGS. 4A to 4F each show a method for producing an optoelectronic component according to an embodiment.
Figure 3B:
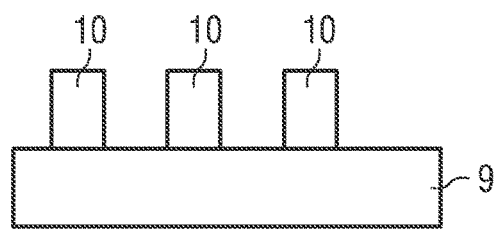
Figure 3C:
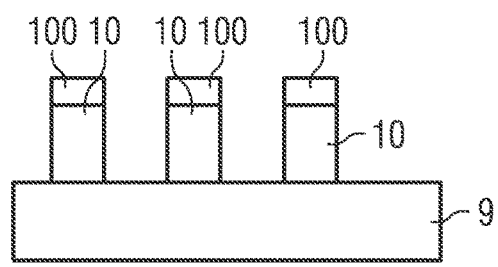
Figure 3D:
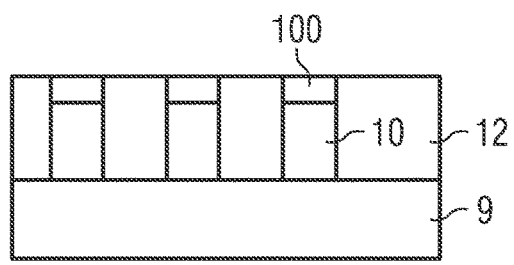
Figure 3E:
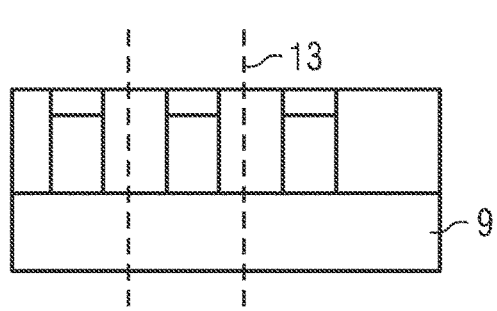
Figure 3F:
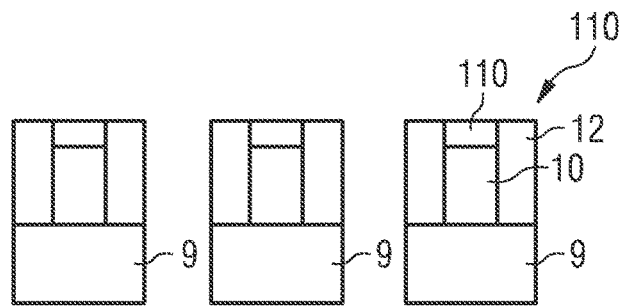

FIGS. 3A to 3F show a method for producing an optoelectronic component no according to an embodiment. For production, a carrier or substrate 9, for example, a silicon wafer, is provided (FIG. 3A). As shown in FIG. 3B, at least one optoelectronic semiconductor chip 10 is arranged on said substrate 9. In particular, more than one optoelectronic semiconductor chip 10 can also be arranged on the substrate 9. FIG. 3B shows, by way of example, the arrangement of three optoelectronic semiconductor chips 10. The optoelectronic semiconductor chips 10 can in each case be followed by a conversion element 100. In particular, said conversion element 1000, as a prefabricated body, is arranged on the radiation exit area 101 of the optoelectronic semiconductor chip 10 in the so-called pick-and-place process (FIG. 3C). In particular, the conversion element is produced using the method according to claim 1. Subsequently, as shown in FIG. 3D, the semiconductor chips 10 can be encapsulated. This can be done, for example, using a potting 12 made of silicone. The potting 12 can additionally have scattering particles, for example, titanium dioxide and/or $Al_2O_3$ (not shown here). In particular, the potting 12 is arranged as far as the upper conversion element edge 100. In other words, the surface of the conversion element 100 and the upper surface of the potting are flush with each other. In particular, the flush production is due to the sharp edges of the conversion element 100. The potting is in particular not arranged on the surface of the conversion element, since otherwise the scattering particles, for example, titanium dioxide, would reduce a coupling out of light. Subsequently, the composite of the semiconductor chips 10 can be singulated 13 (FIG. 3E). As shown in FIG. 3F, optoelectronic components 110, which have a substrate 9, a semiconductor chip 10, a potting 12 and a conversion element 110, result.

Figure 4A:
Figure 4B:
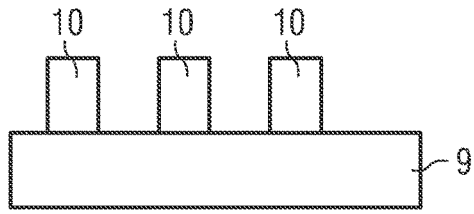
Figure 4C:
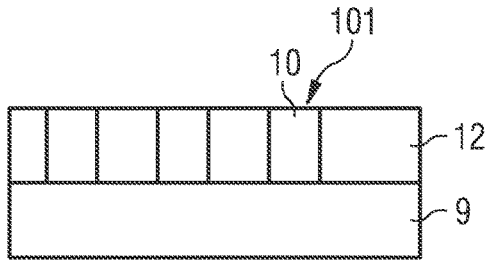
Figure 4D:
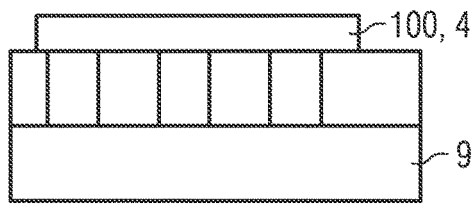
Figure 4E:
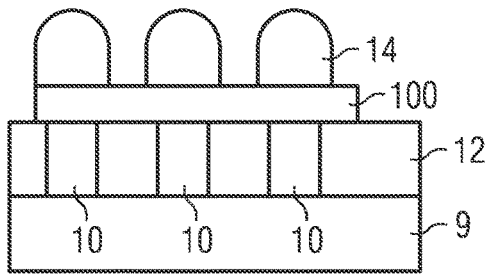
Figure 4F:
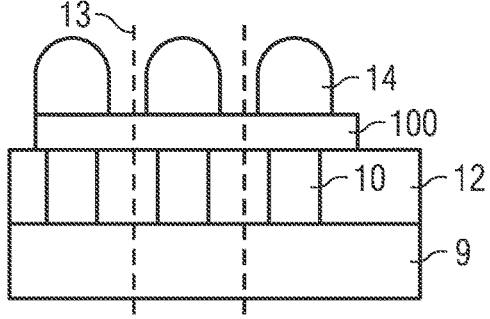

FIGS. 4A to 4F show a method for producing an optoelectronic component no according to an embodiment. In particular, the optoelectronic component 110 has a conversion element 100, as described above. FIG. 4A shows the provision of a substrate 9. FIG. 4B shows the arrangement of at least one semiconductor chip 10 on the substrate 9. As shown in FIG. 4C, the optoelectronic semiconductor chip 10 is encapsulated by means of a potting 12. In other words, the side faces of the respective semiconductor chip 10 are in direct mechanical contact with the potting 12. In particular, the respective radiation exit area 101 of the semiconductor chip 10 remains free of the potting 12. The potting 12 can be made of silicone. Alternatively or additionally, the potting can have scattering particles, such as titanium dioxide. Subsequently, as shown in FIG. 4D, the washed precipitate 4 is applied to the optoelectronic semiconductor chip, in particular onto the radiation exit area 101 of the optoelectronic semiconductor chip. This can be carried out by means of spray coating. The precipitate 4 can be cured, for example, by means of a gas flow or by means of steam. The conversion element 100 is produced on the optoelectronic semiconductor chip 10. Subsequently, a lens 14 can be applied on the conversion element 100. The lens 14 is formed in particular from silicone. Subsequently, the composite of the optoelectronic components 110 can be singulated, as shown in FIG. 4F.

The exemplary embodiments described in conjunction with the Figures and the features thereof can also be combined with one another in accordance with further exemplary embodiments, even if such combinations are not explicitly disclosed in connection with the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A method for producing a conversion element for an optoelectronic component, the method comprising:
   providing an acidic medium having a pH value of less than 2;
   adding a conversion material into the acidic medium thereby forming a mixture;
   adding a silicate solution having a viscosity between 2 and 10 000 poise inclusive to the mixture such that the pH value during the addition of the silicate solution is smaller than 2;
   obtaining a precipitate which contains the conversion material and silicon dioxide as a matrix material;
   separating the precipitate;
   washing the precipitate with a washing medium, wherein the washing medium has a pH value of less than 2; and
   hardening the precipitate thereby forming the conversion element.

2. The method according to claim 1, further comprising:
   converting the precipitate into a mold before hardening the precipitate; and
   curing during hardening by a gas flow under pressure.

3. The method according to claim 2, wherein the mold comprises a screen.

4. The method according to claim 1, wherein the conversion material is selected from the group consisting of $(Y,Lu,Gd,Tb)_3(Al_{1-x}Ga_x)_5O_{12}$, $(Ba,Sr,Ca)Si_2O_2N_2$, $(Ba,Sr,Ca)_2SiO_4$, $(Ba,Sr,Ca)_2Si_5N_8$, $(Sr,Ca)AlSiN_3Si_2N_2O$, $(Sr,Ca)AlSiN_3$ and $Ca_8Mg(SiO_4)_4Cl_2$.

5. The method according to claim 1, wherein adding the conversion material comprises homogeneously dispersing the conversion material.

6. The method according to claim 1, wherein the conversion material has a proportion of 50% by weight to 60% by weight, inclusive, in the matrix material.

7. The method according to claim 1, further comprising applying the conversion element to an optoelectronic semiconductor chip after forming the conversion element.

8. The method according to claim 1, further comprising applying the washed precipitate to an optoelectronic semiconductor chip by spray coating after washing the precipitate and before hardening the precipitate.

9. The method according to claim 1, wherein adding the conversion material further comprises dispersing scattering particles.

10. The method according to claim 1, wherein the acidic medium is selected from a group consisting of hydrochloric acid, phosphoric acid, nitric acid, sulphuric acid, chlorosulfonic acid, sulphuryl chloride, perchloric acid and combinations thereof.

11. The method according to claim 1, wherein the acidic medium is present in concentrated or dilute form.

12. The method according to claim 1, further comprising adding an indicator of a peroxide, which indicates a completeness of the precipitation of the precipitate by color change.

13. The method according to claim 1, further comprising grinding the conversion element after hardening the conversion element.

14. The method according to claim 1, wherein adding a silicate solution comprises a solution of a sodium water glass, potassium water glass or lithium water glass.

* * * * *

UNITED STATES PATENT AND TRADEMARK OFFICE
CERTIFICATE OF CORRECTION

PATENT NO. : 10,287,492 B2
APPLICATION NO. : 15/752563
DATED : May 14, 2019
INVENTOR(S) : Schmidtke Page 1 of 1

It is certified that error appears in the above-identified patent and that said Letters Patent is hereby corrected as shown below:

In Column 10, Line 20, Claim 4, delete "$(Sr,Ca)AlSiN_3Si_2N_2O$" and insert --$(Sr,Ca)AlSiN_3 \cdot Si_2N_2O$--.

Signed and Sealed this
Sixteenth Day of July, 2019

Andrei Iancu
*Director of the United States Patent and Trademark Office*